US008753446B2

(12) United States Patent
Noda et al.

(10) Patent No.: US 8,753,446 B2

(45) Date of Patent: Jun. 17, 2014

(54) SEMICONDUCTOR SINGLE CRYSTAL PRODUCTION DEVICE AND PRODUCING METHOD THEREFOR

(75) Inventors: Akiko Noda, Kanagawa (JP); Tetsuhiro IIda, Kanagawa (JP)

(73) Assignee: Sumco Techxiv Kabushiki Kaisha, Kanagawa (JP)

( * ) Notice: Subject to any disclaimer, the term of this patent is extended or adjusted under 35 U.S.C. 154(b) by 1539 days.

(21) Appl. No.: 11/792,664

(22) PCT Filed: Dec. 13, 2005

(86) PCT No.: PCT/JP2005/022867

§ 371 (c)(1), (2), (4) Date: Jun. 8, 2007

(87) PCT Pub. No.: WO2006/064797

PCT Pub. Date: Jun. 22, 2006

(65) Prior Publication Data

US 2008/0110394 A1 May 15, 2008

(30) Foreign Application Priority Data

Dec. 13, 2004 (JP) ................................ 2004-360094

(51) Int. Cl.
*C30B 15/20* (2006.01)

(52) U.S. Cl.
USPC ............................ 117/213; 117/215; 117/220

(58) Field of Classification Search
USPC ................................................ 117/200–220
See application file for complete search history.

(56) References Cited

U.S. PATENT DOCUMENTS 4,454,096 A * 6/1984 Lorenzini et al. ............ 117/213
5,922,127 A * 7/1999 Luter et al. .................... 117/217
5,942,032 A * 8/1999 Kim et al. ....................... 117/13
6,039,801 A * 3/2000 Holder et al. .................. 117/20
6,146,459 A * 11/2000 Park ............................. 117/217

(Continued)

FOREIGN PATENT DOCUMENTS

JP 54-041280 4/1979
JP 05-117075 5/1993

(Continued)

*Primary Examiner* — Bob M Kunemund

(74) *Attorney, Agent, or Firm* — Handal & Morofsky LLC

(57) ABSTRACT

Evaporated matters and reaction products produced in a furnace can be exhausted without contacting with a graphite crucible and a heater, and an exhaust pipe per se can be maintained at a high temperature to suppress the deposition and condensation of the evaporated matters and reaction products, whereby the clogging of the exhaust pipe is prevented, in addition, a conversion of the exhaust pipes per se into SiC is suppressed to improve the durability of the exhaust pipe, and the change in thermal expansion coefficient is suppressed, whereby a thermal single crystal can be pulled up in high quality. Further, the exhaust pipe is formed of a small number of materials to reduce a production cost. A heat shield (12) made of a heat insulating material is provided outside a heater (6), and a plurality of exhaust pipes (20) are provided between the heater (6) and the heat shield (12). The plurality of exhaust pipes (20) are communicated with a plurality of exhaust ports (8B (22*b*)) provided at a bottom of a chamber 1.

6 Claims, 7 Drawing Sheets

SIDE VIEW

(56) References Cited

U.S. PATENT DOCUMENTS

| | | | | |
|---|---|---|---|---|
| 6,315,828 | B1 * | 11/2001 | Holder et al. | 117/208 |
| 6,409,833 | B2 * | 6/2002 | Park | 117/217 |
| 6,740,160 | B2 * | 5/2004 | Kubo et al. | 117/217 |
| 6,821,344 | B2 * | 11/2004 | Park | 117/217 |
| 6,942,733 | B2 * | 9/2005 | Cherko et al. | 117/208 |
| 2008/0053372 | A1 * | 3/2008 | Anttila et al. | 117/200 |
| 2008/0115720 | A1 * | 5/2008 | Saishoji et al. | 117/217 |
| 2008/0134958 | A1 * | 6/2008 | Bender | 117/15 |
| 2009/0120352 | A1 * | 5/2009 | Kubota et al. | 117/13 |
| 2010/0162946 | A1 * | 7/2010 | Bender | 117/202 |

FOREIGN PATENT DOCUMENTS

| | | |
|---|---|---|
| JP | 05-254982 | 10/1993 |
| JP | 06-056570 | 3/1994 |
| JP | 07-223894 | 8/1995 |
| JP | 09-002892 | 1/1997 |
| JP | 2001-010893 | 1/2001 |
| JP | 2003-089594 | 3/2003 |
| JP | 2004-137089 | 5/2004 |
| JP | 2004-256323 | 9/2004 |

* cited by examiner

SIDE VIEW

A-A' TOP VIEW

SEMICONDUCTOR SINGLE CRYSTAL PRODUCTION DEVICE AND PRODUCING METHOD THEREFOR

CROSS-REFERENCE TO RELATED APPLICATIONS

This application is based on PCT Application No. PCT/JP2005/022867 filed Dec. 13, 2005, which claims priority from Japanese patent application No. 2004-360094 filed Dec. 10, 2004.

TECHNICAL FIELD

The present invention relates to a semiconductor single crystal production device and a producing method therefor.

BACKGROUND ART

A high-purity silicon single crystal is mainly used for the substrate of a semiconductor device. As one of the methods for producing the silicon single crystal, Czochralski process (referred to as "CZ process") is provided. In the CZ process, as one example as shown in FIG. 8, a silicon polycrystal is filled in a quartz crucible 5 disposed in a chamber 1 of a semiconductor single crystal production device, the silicon polycrystal is heated and melted into a melt 4 by a heater 6 provided around the quartz crucible 5, then a seed crystal attached to a seed chuck 14 is immersed into the melt 4, and the seed chuck 14 is pulled up while rotating the seed chuck 14 and the quartz crucible 5 in the same direction or a reverse direction, whereby the silicon single crystal 9 is grown. In addition, in FIG. 8, a heat insulating cylinder 7 is made of a heat insulating material.

If the silicon polycrystal filled in the quartz crucible 5 is melted, SiO gas is produced and vaporized from the surface of the melt by allowing the melt 4 to react with the quartz crucible 5. If the SiO gas formed in an amorphous condition is condensed and deposited on an internal surface of the quartz crucible 5, the surface of a single crystal 9 that is being pulled up and an internal wall of the chamber 1 and the like, and the amorphous SiO is exfoliated into the melt 4, it is deposited on the single crystal that is being grown to cause dislocation and deterioration of a yield.

In addition, if the heater 6, the graphite crucible 3, or the heat insulating cylinder 7 is heated at a high temperature, CO, $CO_2$ and the like are produced, and if the gas is mixed into the melt 4, the carbon concentration of the single crystal that is being grown is increased. In order to solve such a problem, the evaporated matters and reaction products are exhausted to the outside of a furnace by using inert gases such as argon.

Namely, as shown in arrows in FIG. 8, the inert gas introduced from above the chamber 1 goes down along the single crystal 9, then goes up along the internal wall of the quartz crucible 5 from the surface of the melt, goes down in a space between the graphite crucible 3 and the heater 6 or a space between the heater 6 and the heat insulating cylinder 7, passes through exhaust ports at a bottom of the chamber 1 and external exhaust pipes, and is finally exhausted to the outside of the furnace together with the evaporated matters and reaction products.

However, in the case of the structure as shown in FIG. 8, the evaporated matters and reaction products are deposited on the graphite crucible 3, the heater 6, the heat insulating cylinder 7 and the like while they are conveyed halfway to the outside of the furnace together with the inert gas. In the graphite crucible 3, the inert gas containing the evaporated SiO contacts with the graphite crucible to allow the SiO to react with the graphite thereby to promote a conversion of the graphite crucible 3 into SiC. Due to this phenomenon, a difference in thermal expansion coefficient between the formed SiC and graphite causes the graphite crucible 3 to be deformed as the number of use of the graphite crucible 3 is increased. On the other hand, as for the heater 6, the inert gas containing the evaporated SiO contacts with the heater 6 to allow the SiO to react with the graphite thereby to quickly thin a central section and a slit terminal section of the heater 6 that are heated at a high temperature. As a result, the temperature distribution of the melt 4 is changed to badly affect the quality of the single crystal, for example, the concentration of oxygen contained in it, Then, in order to solve the afore-mentioned defect, in the below-mentioned Patent Reference 1, as shown in FIG. 9, an internal cylinder (heat shield) 11 is provided adjacent to an outer periphery of the heater 6 and an external cylinder (heat shield) 12 covering an internal periphery of the heat insulating cylinder 7 is provided to arrange a space between the internal cylinder 11 and the external cylinder 12 as an exhaust path, thereby to exhaust the inert gas.

According to this configuration, as shown in arrows in FIG. 9, the argon gas introduced from above the chamber 1 passes through a space between the lower end of a radiation screen 10 and the melt 4, then goes up along an internal surface of the quartz crucible 5, and goes down in a space between the internal cylinder 11 and the external cylinder 12 and is exhausted to the outside of the furnace.

Thus, because the gas such as SiO produced from the melt 4 does not contact with the graphite crucible 3 and the heater 6, the conversion of the graphite crucible 3 and the heater 6 into SiC can be delayed, whereby the useful lives of the graphite crucible 3 and the heater 6 are greatly prolonged.

In addition, the below-mentioned Patent Reference 2 describes the single crystal production device of a structure such that a heat insulating material is provided externally of the heater and the exhaust pipes are provided externally of the heat insulating material.

In addition, the below-mentioned Patent Reference 3 describes the single crystal production device of a structure such that a heat insulating material is provided externally of the heater and an exhaust pipe is provided so as to penetrate the heat insulating material.

Patent Reference 1: Japanese Patent Application Laid-Open No. H07-223894

Patent Reference 2: Japanese Patent Application Laid-Open No. H09-2892

Patent Reference 3: Japanese Patent Application Laid-Open No. 2001-10893

DISCLOSURE OF THE INVENTION

Problems to be Solved by the Invention

However, under the structure shown in FIG. 9, the heat generated in the heater 6 is blocked by the internal cylinder 11, the temperature of the external cylinder 12 becomes significantly low, for example, about 1600K or less. If the temperature of the external cylinder 12 becomes low, the evaporated matters and reaction products produced in the furnace by allowing the exhaust gas to contact with the furnace are liable to be deposited and condensed on the external cylinder 12. Due to this phenomenon, the exhaust path between the internal cylinder 11 and the external cylinder 12 may be clogged by the deposition, thereby to probably inhibit an exhaust capacity. In addition, the resumption of the process may be impossible depending upon conditions.

In addition, the low temperature external cylinder 12 is liable to be easily converted into SiC, the number and time of use until it is broken may be shortened by the conversion into SiC, the external cylinder may be forced to be replaced with a new one earlier, resulting in a cost increase.

Particularly, because the external cylinder 12 is of a structure that supports the radiation screen 10, if the exhaust gas contacts with the external cylinder 12 to promote the conversion into SiC, thermal expansion coefficient is changed at a region that is converted into SiC. Then, if thermal expansion coefficient in the external cylinder 12 is changed as the number and time of use are increased, the height position of the radiation screen 10 supported by the external cylinder 12 is changed. Here, the distance between the lower end position of the radiation screen 10 and the melt largely affects the quality of the pulled up single crystal 9 to be pulled up.

If the height position of the radiation screen 10 is changed by the change of thermal expansion coefficient in the external cylinder 12, the distance between the lower end position of the radiation screen 10 and the melt may probably deviate from an initially set value to badly affect the quality of the single crystal 9.

In addition, because the exhaust pipes described above in Patent Reference 2 and Patent Reference 3 are provided externally of the heat insulating material on the external side of the heater or in the heat insulating material on the external side of the heater, the temperature of the exhaust pipes becomes low by thermally insulating the heat generated in the heater, the exhaust pipe may probably have the problem that the number of use may deteriorate due to the clogging of the exhaust path and the conversion of the exhaust pipe into SiC as in the single crystal production device (FIG. 9) described above in Patent Reference 1.

In addition, because the exhaust pipe made of the internal cylinder 11 and the external cylinder 12 described above in Patent Reference 1 is cylindrically formed so as to surround the periphery of the heater 6, it is a member of big diameter and large scale, which has a problem that the production cost is high.

The present invention is made in view of these circumstances and aims at solving a first problem to make it possible to exhaust the evaporated matters and reaction products produced in the furnace to the outside without allowing them to contact with the graphite crucible and the heater, and to maintain the exhaust pipe per se at a high temperature, whereby the deposition and condensation of the evaporated matters and reaction products are suppressed to prevent the clogging of the exhaust pipe, in addition, to suppress the conversion of the exhaust pipe per se into SiC to improve the durability of the exhaust pipe, and further, to suppress the change of thermal expansion coefficient in the member supporting the radiation screen to pull up the single crystal in high quality.

Further, the present invention aims at solving, in addition to the first problem, a second problem to make it possible to reduce a production cost by composing the exhaust pipe with a little quantity of materials.

Means for Solving the Problems

A first invention provides a semiconductor single crystal production device including a chamber in which a crucible for melting a raw material of a semiconductor single crystal and a heater that is provided around the crucible and that heats the raw material in the crucible are disposed, the semiconductor single crystal production device having a pulling-up mechanism for immersing a seed crystal into the melted raw material and pulling up a single crystal, characterized in that a plurality of exhaust pipes are provided outside the heater and along a peripheral direction of the heater.

A second invention provides the device according to the first invention, in which a heat shield is provided outside the heater, and the plurality of exhaust pipes are provided between the heater and the heat shield and along the peripheral direction of the heater.

A third invention provide the device according to the first invention, in which a heat insulating cylinder is provided outside the heater, and the plurality of exhaust pipes are provided between the heater and the heat insulating cylinder and along the peripheral direction of the heater.

A fourth invention provide the device according to any one of the first to the third inventions, in which the plurality of exhaust pipes are communicated with a plurality of exhaust ports provided at a bottom in the chamber.

A fifth invention provides the device according to the second invention, in which the plurality of exhaust pipes are ones having partitions independent of the heat shield.

A sixth invention provides the device according to the second invention, in which the plurality of exhaust pipes are ones having partitions common with the heat shield.

A seventh invention provides a method for producing a semiconductor single crystal using the semiconductor single crystal production device according to any one of the first to sixth inventions.

As shown in FIG. 1, because the aperture at the upper end of the exhaust pipe 20 is positioned above the upper end of the heater 6, and the aperture at the lower end of the exhaust pipe 20 is communicated with the exhaust port **8*b*, the argon gas flows only inside the exhaust pipe 20 without almost contacting with the graphite crucible 3 and the heater 6. Due to this phenomenon, as in the prior art described in FIG. 9, the conversion of the graphite crucible 3 and the heater 6** into SiC is avoided, whereby the lifetime is largely prolonged.

Further, because the exhaust pipe 20 of the present invention is provided between the heater 6 and the heat shield 12 and is made of a material excellent in thermal conductivity, the exhaust pipe 20 is maintained at a high temperature, differing from the prior art. According to the present invention, this allows the deposition and condensation of the evaporated matters and reaction products on the exhaust pipe 20 to be suppressed thereby to prevent the clogging of the exhaust pipe 20 and suppress the conversion of the exhaust pipe 20 into SiC. Further, this also allows a time for replacing the exhaust pipe 20 with a new one to be prolonged to save the cost. Further, because the heat insulating cylinder 7 almost scarcely contacts with the evaporated SiO even if the heat insulating cylinder 7 is not covered with the heat shield 12, the heat shield 12 is not required and thus the cost may be further saved.

In addition, according to the present invention, because the exhaust gas almost scarcely contacts with the heat shield 12, the conversion of the heat shield 12 into SiC is suppressed. This allows a time for replacing the heat shield 12 with a new one to be prolonged, whereby the cost is saved. In addition, because the change of thermal expansion coefficient in the heat shield 12 can be suppressed, the distance between the lower end position of the radiation screen 10 supported by the heat shield 12 and the melt can be maintained at an initially set value, the pulled up single crystal can be maintained in high quality, whereby the yield of products is improved.

In addition, particularly according to the fourth invention, because the exhaust pipe 20 is a small-size and small-diameter member that is cylindrically formed with a small cross-section communicating with a relatively small area-exhaust port 8*b* (exhaust hole 22*b*), the production cost can be suppressed to a low level.

The present invention is not limited to the configuration shown in FIG. 1, and any configuration may be employed if a plurality of exhaust pipes 20 are provided outside the heater 6 and along the peripheral direction of the heater 6 (First Invention).

For example, as shown in FIG. 10, a plurality of exhaust pipes 20 may be provided between the heater 6 and the heat shield 12 and along the peripheral direction of the heater 6 (Second Invention).

In addition, a plurality of exhaust pipes 20 may be ones having partitions independent of the heat shield 12 (Fifth Invention) or may be ones sharing partitions with the heat shield 12 (Sixth Invention).

For example, as shown in FIG. 11, a plurality of exhaust pipes 20 may be provided between the heater 6 and the heat shield 12 and along the peripheral direction of the heater 6 (Second Invention) and may be configured by exhaust pipes having partitions common with the heat shield 12 (Sixth Invention).

In addition, as shown in FIG. 12, a plurality of exhaust pipes 20 may be provided outside the heat shield 12 and along the peripheral direction of the heat shield 12, and may be configured by exhaust pipes having partitions common with the heat shield 12.

In addition, according to the semiconductor single crystal producing method of the present invention, because the change of thermal expansion coefficient in the heat shield 12 can be suppressed and the distance between the lower end position of the radiation screen 10 and the melt can be maintained at an initially set value, a high quality-single crystal can be stably pulled up and produced, and because the useful lives of the employed parts can be largely prolonged, whereby the cost for producing the single crystal is suppressed to a low level (Seventh Invention).

BEST MODE FOR CARRYING OUT THE INVENTION

Embodiments of a semiconductor single crystal production device according to the present invention are described with reference to the drawings.

FIG. 1 shows a configuration of a silicon single crystal production device of an embodiment according to the present invention in a cross-section.

FIG. 1(*a*) is a side view and FIG. 1(B) is a top view. The A-A' cross-section in FIG. 1(*a*) is equivalent to the top view of FIG. 1(B) and the B-B' cross-section in FIG. 1(B) is equivalent to the side view of FIG. 1(*a*).

As shown in these views of FIG. 1, a crucible axis 2 is provided at the center of a chamber 1. The center axis of the crucible axis 2 is equivalent to that of the chamber 1. An upper end of the crucible axis 2 supports a graphite crucible 3 through an unillustrated crucible receiver.

A quartz crucible 5 is accommodated in the graphite crucible 3. The quartz crucible 5 contains a melt 4.

A cylindrical heater 6 is provided outside the graphite crucible 3 in such a manner as to surround the periphery of the graphite crucible 3. Further, a cylindrical heat insulating cylinder 7 is provided outside the heater 6 in such a manner as to surround the periphery of the heater 6. The heat insulating cylinder 7 is made of a heat insulating material and is provided along the internal wall on the side of the chamber 1. The heater 6 and the heat insulating cylinder 7 are provided concentrically relative to the center (center axis 2*c*) of the quartz crucible 5.

A single crystal 9 is pulled up from the center of the quartz crucible 5. Namely, a seed crystal attached to a seed chuck 14 is immersed into the melt 4 and the single crystal silicon 9 is grown by pulling up the seed chuck 14 while rotating the seed chuck 14 and the quartz crucible 5 in the same direction or a reverse direction.

In addition, a heat insulating bottom 8 similarly made of the heat insulating material is provided at the bottom of the chamber 1. A hole 8*a* into which the crucible axis 2 is inserted is formed at the central position of the heat insulating bottom 8.

In addition, the exhaust ports 8*b* are formed at four places at even intervals along the circumferential direction of the heat insulating bottom 8. The exhaust ports 8*b* are provided to exhaust the gas in the furnace later described.

An annular disc-heat insulating member 13 similarly made of the heat insulating material is provided at the upper end of the heat insulating cylinder 7. The upper end of the radiation screen 10 is connected to the heat insulating member 13.

The radiation screen 10 is a heat shield that surrounds a single crystal pulling-up region, and a conical and cylindrical member with a diameter of an aperture at the lower end smaller than that of an aperture at the upper end.

The radiation screen 10 blocks the radiant heat applied to the single crystal 9 from the melt 4, the quartz crucible 5 and so on to facilitate the cooling of the single crystal 9, thereby accelerating a single crystal pulling-up speed and preventing the generation of crystal defects. In addition, the radiation screen 10 has a function to induce the inert gas (argon gas) introduced from above the chamber 1 to the periphery of the single crystal 9 to form the flow of the gas from the central section through an edge section of the quartz crucible 5 to the exhaust ports 8*b* of the chamber bottom, thereby to eliminate the evaporated matters and reaction products such as SiO produced from the melt 4 that inhibit single crystallization.

The internal peripheral surface of the heat insulating cylinder 7 is covered with a cylindrical heat shield 12 made of a heat insulating material. The heat shield 12 is equivalent to the external cylinder 12 described in the prior art in FIG. 9. The heat shield 12 is, for example, made of carbon or a carbon fiber-reinforced carbon. In addition, the heat shield 12 may be also provided closely to the internal peripheral surface of the heat insulating cylinder 7 or adjacent thereto.

In the embodiment of the present invention, further, the exhaust pipe 20 made of a material excellent in thermal conductivity is provided between the heater 6 and the heat shield 12. A plurality (four pieces) of the exhaust pipes 20 are provided so as to each communicates with each of a plurality (four pieces) of the exhaust ports 8*b* formed in the heat insulating bottom 8 at the bottom of the chamber 1.

Namely, the exhaust pipe 20 is a cylindrical member where the upper end is positioned above the heater 6 and the lower end is positioned at the exhaust port 8*b* of the heat insulating bottom 8 and is provided outside the heater 6 and is disposed inwardly of the heat shield 12. The cross-section of the exhaust pipe 20 (cross-section of exhaust path) is, for example, rectangularly formed.

The exhaust pipe 20 is provided by being spaced out at a predetermined distance from the heater 6, and is also provided by being spaced out at a predetermined distance from the heat shield 12.

The exhaust pipe 20 is made of a material that is of a relatively excellent thermal conductivity and heat resistance property, for example, graphite, carbon fiber-reinforced carbon or ceramics.

The upper end of the exhaust pipe 20 is supported by the heat shield 12 through the exhaust pipe fixing ring 21 and the lower end thereof is supported by a support member 22.

Namely, the annular disc exhaust pipe fixing ring 21 formed so as to cover the upper end of the heater 6 is provided above the heater 6. The outer periphery of the exhaust pipe fixing ring 21 is bonded to the heat shield 12, and the graphite crucible 3 (quartz crucible 5) is positioned at the central hole of the exhaust pipe fixing ring 21.

A rectangular hole 21*a* corresponding to an external shape of the exhaust pipe 20 is formed in the exhaust pipe fixing ring 21. Inserting the exhaust pipe 20 into the rectangular hole 21*a* allows the upper end of the exhaust pipe 20 to be supported by the heat shield 12 through the exhaust pipe fixing ring 21 and the upper end of the exhaust pipe 20 is fixed in the chamber 1.

An external surface of the heat insulating bottom 8 is covered with a disc support member 22. Four exhaust holes 22*b* are formed at the positions each corresponding to the afore-mentioned four exhaust ports 8*b* in the support member 22. A rectangular flange 22*a* corresponding to the external shape of the exhaust pipe 20 is formed at the periphery of the exhaust hole 22*b*. The rectangular flange 22*a* is inserted into the exhaust port 8*b* and the lower end of the exhaust pipe 20 is fitted into the flange 22*a* allows the lower end of the exhaust pipe 20 to be supported by the support member 22 and the lower end of the exhaust pipe 20 to be fixed in the chamber 1. The exhaust path cross-section of the exhaust pipe 20 is set so as to be the same as in the exhaust hole 22*b*.

In addition, although it is desirable that the cross-section of the exhaust pipe in the present invention is bigger than that of the exhaust port to reduce pressure drop, it may be smaller than the cross-section of the exhaust port depending upon the capacity of a pump, pressure in the furnace, and gas flow rate.

Next, the gas flow in the silicon single crystal production device of the afore-mentioned configuration is described.

At the time of pulling-up the single crystal 9, the inert gas (argon gas) is introduced into the chamber 1 from above the chamber 1. The argon gas, as shown in the arrow g1 in FIG. 1, goes down on the outer periphery of the single crystal 9, after it passes through a space between the lower end of the radiation screen 10 and the melt 4, and goes up along the internal surface of the quartz crucible 5. Then, as shown in the arrow g2, the argon gas goes down inside the exhaust pipe 20, and as shown in the arrow g3, it passes though the exhaust hole 22*b* (exhaust port 8*b*) and is exhausted to the outside of the chamber 1.

Because the aperture at the upper end of the exhaust pipe 20 is positioned above the upper end of the heater 6 and the aperture at the lower end thereof is communicated with the exhaust port 8*b*, the argon gas flows only inside the exhaust pipe 20 without almost contacting with the graphite crucible 3 and the heater 6. As in the prior art described in FIG. 9, this allows the conversion of the graphite crucible 3 and the heater 6 into SiC to be avoided, whereby the lifetime of the exhaust pipe 20 is largely prolonged.

Further, because the exhaust pipe 20 of the embodiment is provided between the heater 6 and the heat shield 12 and is made of the material excellent in thermal conductivity, the exhaust pipe 20 is maintained at a high temperature, differing from the prior art, and the exhaust gas does not directly flow around the heat shield 12. Namely, in the case of the prior art described in FIG. 9, because the heat shield 12 per se configures the external cylinder of the exhaust pipes, the temperature of the exhaust pipe per se becomes low, and the evaporated matters and reaction products are liable to be deposited and condensed on the external cylinder 12. In the experiment, it is confirmed that the temperature of a place out of the surface of the external cylinder 12 where the evaporated matters and reaction products are liable to be deposited and condensed is 1600K. Further, it is confirmed that the temperature at the depth of 10 mm in the external cylinder 12 is 1500K or less.

On the contrary, as for the exhaust pipe 20 of the embodiment, the heat generated in the heater 6 is directly transmitted to the periphery of the exhaust pipe 20 and the exhaust pipe 20 is maintained at a high temperature. In the experiment, it is confirmed that the temperature of the exhaust pipe 20 is maintained at around 1800K. This allows the deposition and condensation of the evaporated matters and reaction products on the exhaust pipe 20 to be avoided. Due to this phenomenon, according to the embodiment, the clogging of the exhaust pipe 20 is prevented. In addition, the conversion of the exhaust pipe 20 into SiC is suppressed. This allows a time for replacing the exhaust pipe 20 with a new one to be prolonged, whereby the cost is saved.

In addition, according to the embodiment of the present invention, because the exhaust gas seldom contacts with the heat shield 12, the conversion of the heat shield 12 into SiC is suppressed. This allows a time for replacing the heat shield 12 with a new one to be prolonged, whereby the cost is saved. In addition, because the change of thermal expansion coefficient in the heat shield 12 can be suppressed, the distance between the lower end position of the radiation screen 10 supported by the heat shield 12 and the surface of the melt can be maintained at an initially set value, whereby the pulled-up single crystal is maintained in high quality and the yield of products is improved.

In addition, because the exhaust pipe 20 of the embodiment is a small-size and small-diameter member that is cylindrically formed with a small cross-section that is communicated with the exhaust port 8*b* (exhaust hole 22*b*) of relatively small area, the production cost can be suppressed to a low level.

Variously modified embodiments may be possibly implemented to the afore-mentioned embodiments.

FIG. 2 to FIG. 5 each exemplifies a method for fixing the exhaust pipe 20.

In FIG. 2, a cross-sectional L-shaped hook member 20*a* is formed at the upper end of the exhaust pipe 20 and the hook member 20*a* is engaged with the upper end of the heater 6, whereby the exhaust pipe 20 is supported by the heater 6, and the exhaust pipe 20 is fixed in the chamber 1.

In addition, in FIG. 2, the exhaust pipe 20 is in contact with the heater 6. However, a structure such that the exhaust pipe 20 is supported by the heater 6 through, for example, a non-conductive member without allowing the exhaust pipe 20 to contact with the heater 6 may be also provided.

In FIG. 3, a cross-sectional L-shaped hook member 20*b* is formed at the upper end of the exhaust pipe 20, the hook member 20*b* is engaged with the cross-sectional L-shaped hook receiving member 12*a* formed in the heat shield 12, whereby the exhaust pipe 20 is supported by the heat shield 12 and the exhaust pipe 20 is fixed in the chamber 1.

In addition, in FIG. 3, the side of the exhaust pipe 20 is spaced out from the internal peripheral surface of the heat shield 12. However, the side of the exhaust pipe 20 may be disposed so as to contact with the internal peripheral surface of the heat shield 12.

FIG. 4 and FIG. 5 each exemplifies an exhaust pipe fixing guide member formed on the internal peripheral surface of the heat shield 12.

In FIG. 4 guide members 12*b* and 12*c* are intermittently provided in the longitudinal direction of the exhaust pipe 20, and as shown in the arrow C, the exhaust pipe 20 is inserted between the guide members 12*b*, 12*c* and is engaged with the guide members 12*b*, 12*c*, whereby the exhaust pipe 20 is supported by the heat shield 12 and is fixed in the chamber 1.

In FIG. 5, guide members 12*d* and 12*e* are continuously formed in the longitudinal direction of the exhaust pipe 20, and as shown in the arrow D, the exhaust pipe 20 is inserted between the guide members 12*d*, 12*e* and is engaged with the guide members 12*d*, 12*e*, whereby the exhaust pipe 20 is supported by the heat shield 12 and is fixed in the chamber 1.

By the way, it is estimated that because the temperatures are different, particularly the lower section of the exhaust pipe is at a low temperature at each place of the exhaust pipe 20 in the upward and downward directions, it is anticipated that the conversion into SiC is accelerated and the replacement cycle is shortened. On the other hand, because the upper section of the exhaust pipe 20 is at a high temperature, a replacement cycle can be prolonged. Then, the exhaust pipe 20, as shown in FIG. 6 and FIG. 7, may be of a structure that is dividable into two sections of the upper and lower sections and is configured so that the exhaust pipe can be replaced by the upper section or the lower section.

FIG. 6 shows the exhaust pipe 20 of a structure such that the cylindrical exhaust pipe 20 can be divided into two sections of an upper exhaust pipe 20U and a lower exhaust pipe 20L in a perspective view. As shown in FIG. 6, a fitting recess 20La is formed at the upper end of the lower exhaust pipe 20L and a fitting salient 20Ua that can be fitted into the fitting recess 20La is formed at the lower end of the upper exhaust pipe 20U, the fitting salient 20Ua of the upper exhaust pipe 20U is fitted into the fitting recess 20La of the lower exhaust pipe 20L, whereby the upper exhaust pipe 20U and the lower exhaust pipe 20L are dividably connected and fixed.

FIG. 7 similarly shows the cylindrical exhaust pipe 20 that is divided into a two-divided structure where the exhaust pipe 20 is divided into the upper exhaust pipe 20U and the lower exhaust pipe 20L in a longitudinal section. As shown in FIG. 7, a flange 20Lb that can fit the lower end of the upper exhaust pipe 20U into the upper end of the lower exhaust pipe 20L is formed and the lower end of the upper exhaust pipe 20U is fitted into the flange 20Lb of the lower exhaust pipe 20L, whereby the upper exhaust pipe 20U and the lower exhaust pipe 20L are dividably connected and fixed.

In addition, in FIG. 6 and FIG. 7, the exhaust pipe 20 of two-divided structure is exemplified. However, an embodiment where the exhaust pipe 20 is divided into three or more may be also possible. In any case, it is desirable that a divided position is in a temperature range in which evaporated matters and reaction products are not deposited and condensed.

In addition, in the afore-mentioned description, the cross-sectional shapes of the exhaust pipe 20 of a rectangular shape (FIG. 1) and circular shapes (FIG. 6 and FIG. 7) are exemplified. However, arbitrary cross-sectional shapes may be also provided without limiting them to these shapes.

In addition, in the afore-mentioned description, the case where the exhaust path cross-sectional area of the exhaust pipe 20 is almost the same one as in the exhaust hole 22*b* (exhaust port 8*b*) at the bottom of the chamber 1 is exemplified. However, in lessening pressure drop, it is desirable that the sum of the exhaust path cross-sectional areas of a plurality of exhaust pipes 20 is bigger than the total area of a plurality of exhaust holes 22*b* (exhaust ports 8*b*) in the chamber 1.

In addition, in the afore-mentioned description, the case where a plurality of exhaust pipes 20 are provided along the peripheral direction of the heat insulating bottom 8 is exemplified. However, the number of the exhaust pipes 20 may be arbitrarily set in accordance with that of the exhaust holes 22*b* (exhaust ports 8*b*) at the bottom in the chamber 1.

In addition, it is unnecessary to allow the plurality of exhaust pipes 20 to communicate one-to-one with the plurality of exhaust holes 22*b* at the bottom in the chamber 1, even the number of the exhaust holes 22*b* may be bigger than that of the exhaust pipes 20, and even the number of the exhaust holes 22*b* may be smaller than that of the exhaust pipes 20. For example, it may be also configured such that two exhaust pipes 20 are aggregated to communicate with one exhaust hole 22*b* or one exhaust pipe 20 is branched to communicate with two exhaust holes 22*b*.

In addition, the length along the peripheral direction of the exhaust pipe 20 may be set at an arbitrary length. In addition, in the above description, it is assumed that a plurality of exhaust pipes 20 are intermittently provided along the peripheral direction of the heat insulating bottom 8. However, the exhaust pipes may be annularly (continuously) formed along the peripheral direction of the heat insulating bottom 8.

In addition, in FIG. 1, the exhaust pipe 20 is disposed to be apart from the heat shield 12 and the heater 6. However, the exhaust pipes 20 may be disposed so as to contact with any one or both of the heat shield 12 and the heater 6.

Namely, the present invention is not limited to the configuration shown in FIG. 1 and any configurations may be proposed, if a plurality of exhaust pipes 20 are provided outside the heater 6 and along the peripheral direction of the heater 6.

Other embodiments are described below with reference to FIG. 10, FIG. 11, and FIG. 12. FIG. 10 to FIG. 12 are the top views corresponding to FIG. 1(*b*).

For example, as shown in FIG. 10, a plurality of exhaust pipes 20 may be provided along the peripheral direction of the heater 6 between the heater 6 and the heat shield 12 and at positions at which the exhaust pipes 20 contact with the heater 6.

In addition, a plurality of exhaust pipes 20 may be ones having partitions independent of the heat shield 12 or may be ones sharing partitions with the heat shield 12.

For example, as shown in FIG. 11, a plurality of exhaust pipes 20 are provided along the peripheral direction of the heater 6 between the heater 6 and the heat shield 12, and the exhaust pipes 20 may be configured by ones having partitions common with the heat shield 12.

In addition, as shown in FIG. 12, a plurality of exhaust pipes 20 are provided outside the heat shield 12 and along the peripheral direction of the heat shield 12, and the exhaust pipes 20 may be configured by ones having partitions common with the heat shield 12.

The embodiments of a semiconductor single crystal production device of the present invention are described as above. The semiconductor single crystal can be produced by using the semiconductor single crystal production device of the above-described embodiments.

According to the method for producing the semiconductor single crystal of the present invention, because the change of thermal expansion coefficient in the heat shield 12 can be suppressed and the distance between the lower end of the radiation screen 10 and the melt can be maintained at an initially set value, a high-quality single crystal can be stably pulled up and produced and the lifetime of the employed parts can be largely prolonged, whereby the production cost of the single crystal is suppressed to a low level.

INDUSTRIAL APPLICABILITY

The present invention can be similarly applied to even a case that a crystal having a resistance value smaller than 0.1

Ωcm is grown from a melt to which a dopant such as phosphorus, arsenic, or antimony is added at a high concentration, because the evaporated matters of the dopant is deposited on the furnace composition member to cause crystal defect. In addition, the present invention can be also applied to a method by the Czochralski process of growing, other than the silicon single crystal, compound crystals and oxide crystals of which evaporated matters are deposited on the furnace composition members or deteriorate the furnace composition members.

Figure 1A:
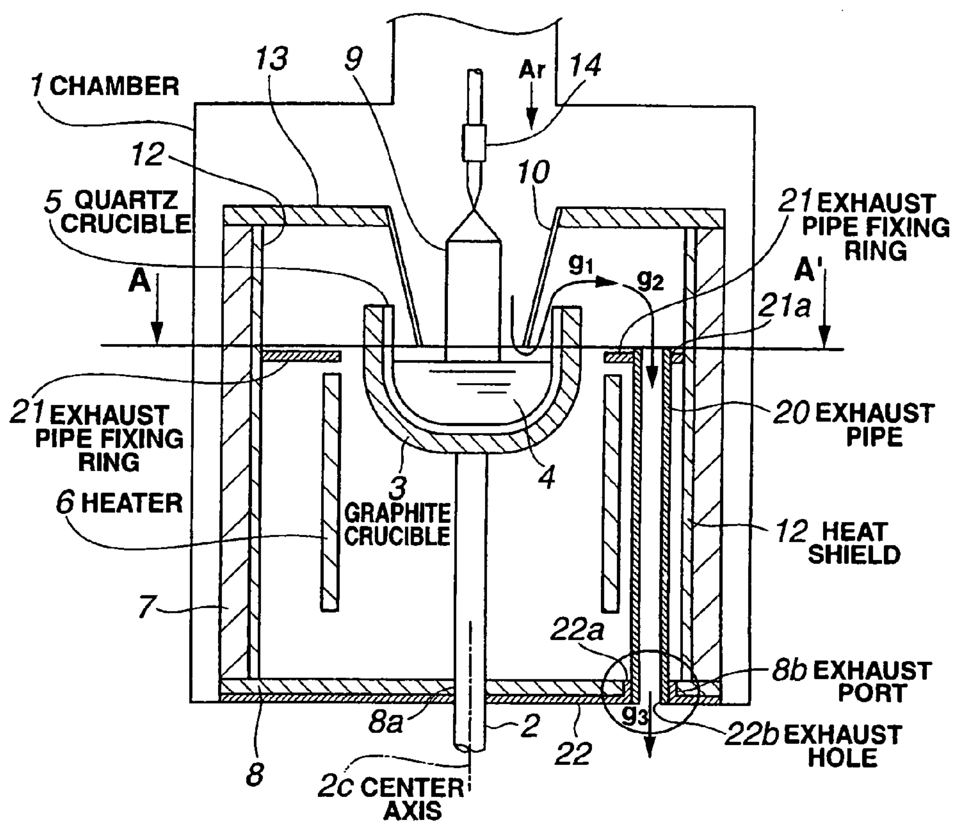
FIG. 1 is a cross-section showing a configuration of a silicon single crystal production device of an embodiment according to the present invention, in which FIG. 1(*a*) is a side view and FIG. 1(*b*) is a top view.
Figure 1B:
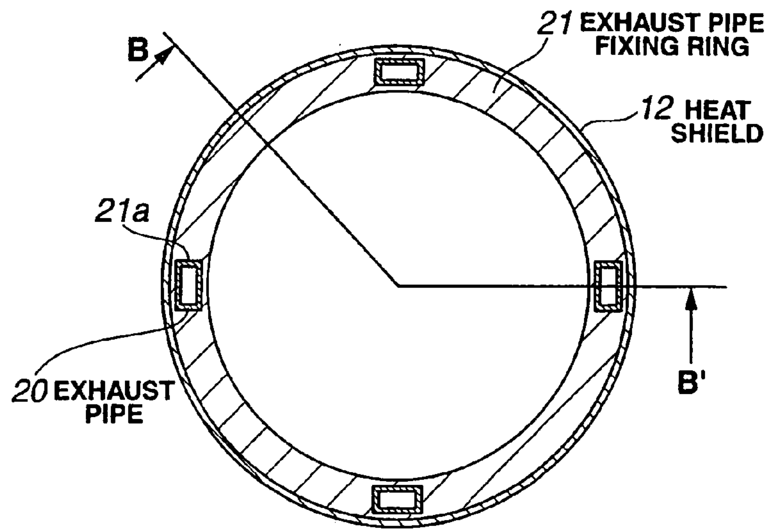
Figure 2:
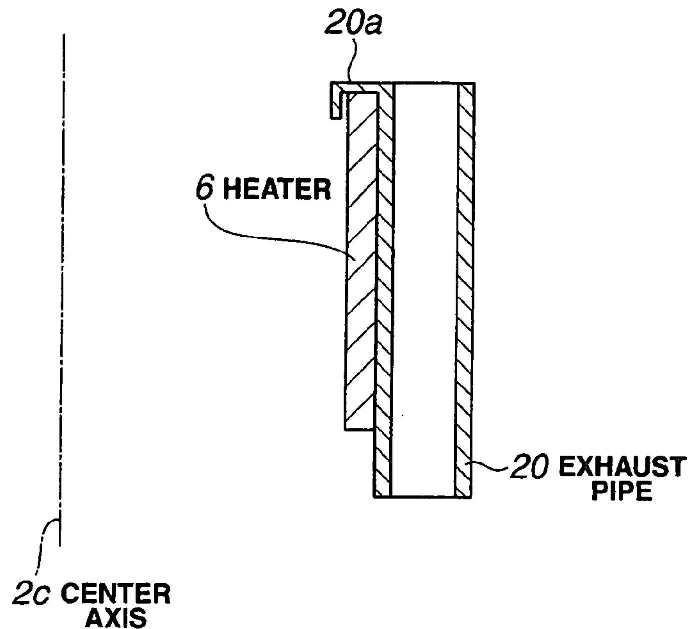
FIG. 2 is a view exemplifying a method for fixing an exhaust pipe.
Figure 3:
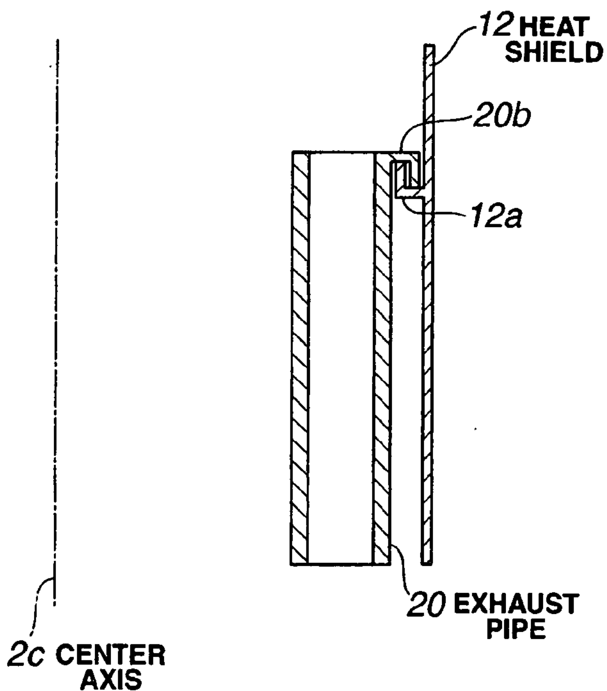
FIG. 3 is a view exemplifying a method for fixing an exhaust pipe.
Figure 4:
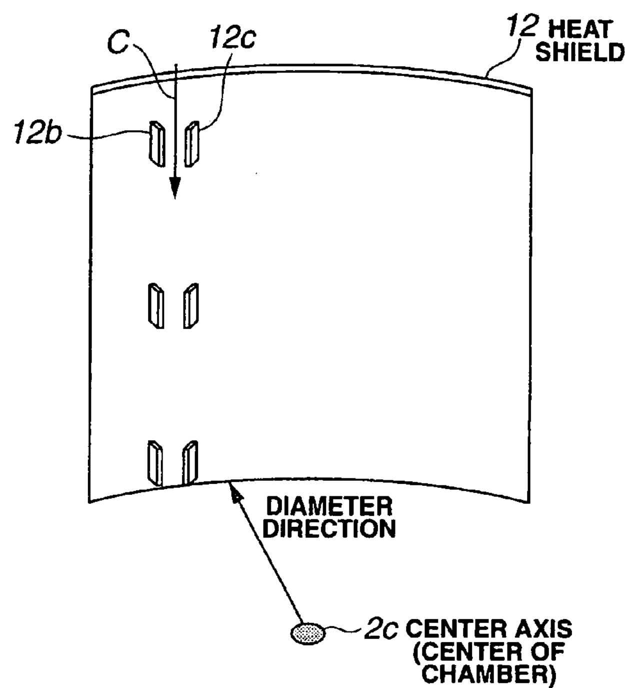
FIG. 4 is a view exemplifying a method for fixing the exhaust pipe.
Figure 5:
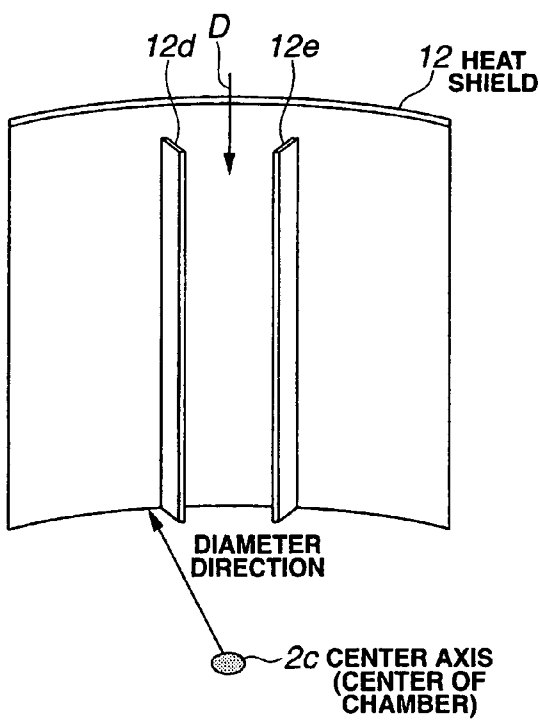
FIG. 5 is a view exemplifying a method for fixing the exhaust pipe.
Figure 6:
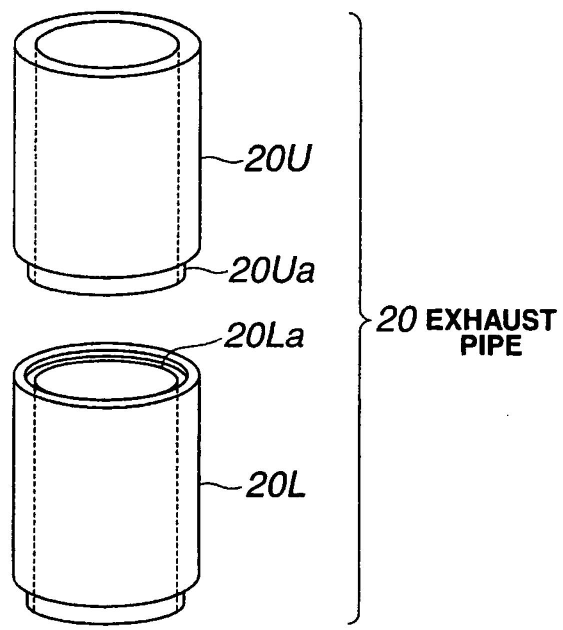
FIG. 6 is a perspective view exemplifying a structure of an exhaust pipe dividable into two sections of upper and lower sections.
Figure 7:
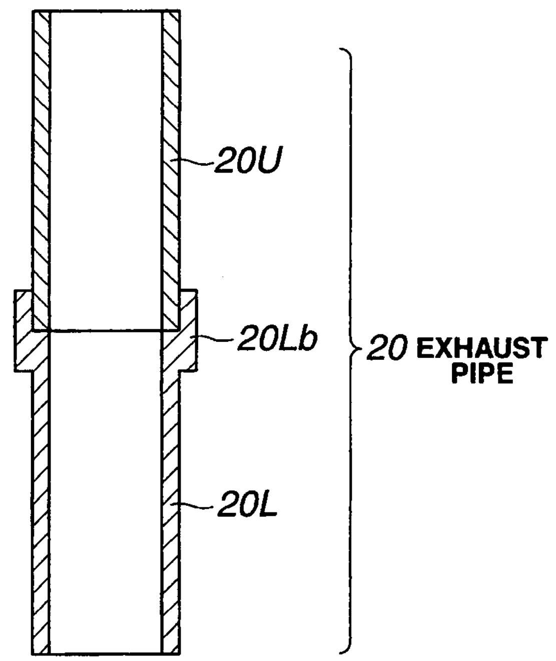
FIG. 7 is a longitudinal section exemplifying a structure of the exhaust pipe dividable into two sections of upper and lower sections.
Figure 8:
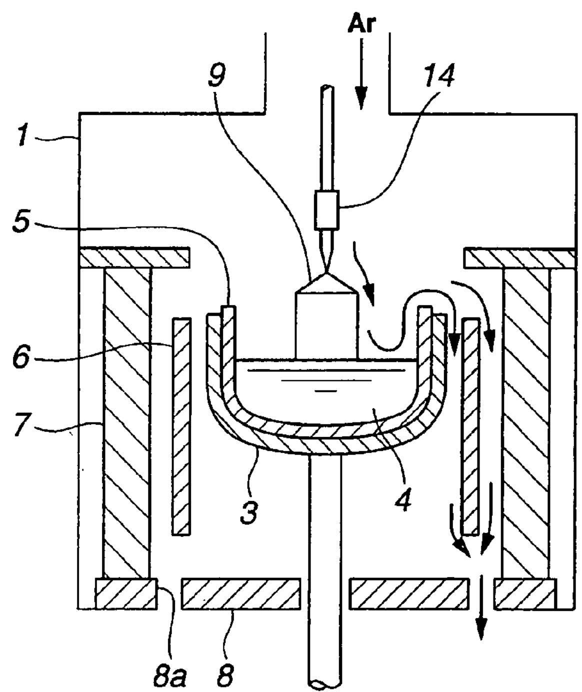
FIG. 8 is a view explaining a prior art.
Figure 9:
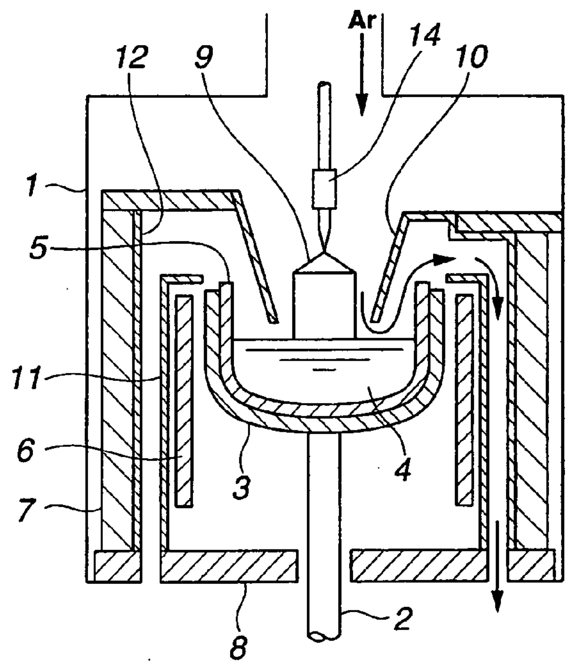
FIG. 9 is a view explaining a prior art.
Figure 10:
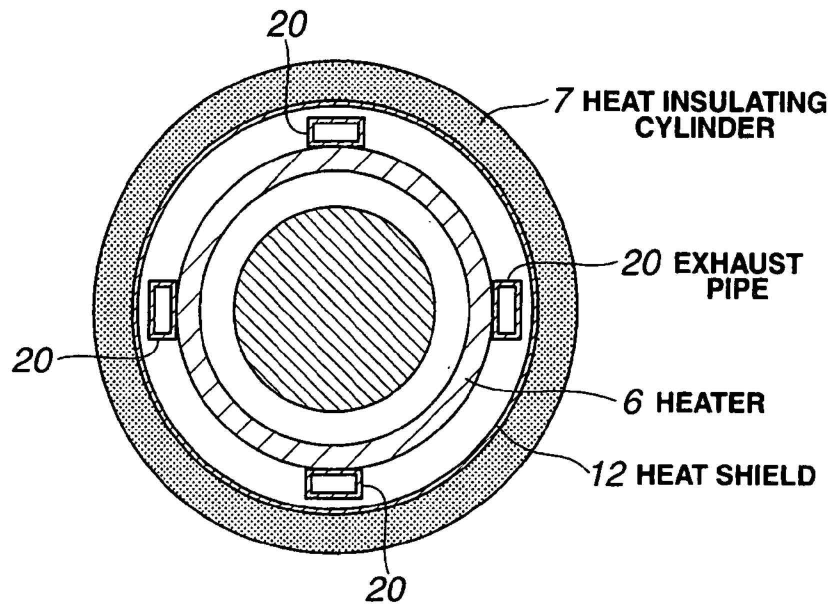
FIG. 10 is a view showing another embodiment.
Figure 11:
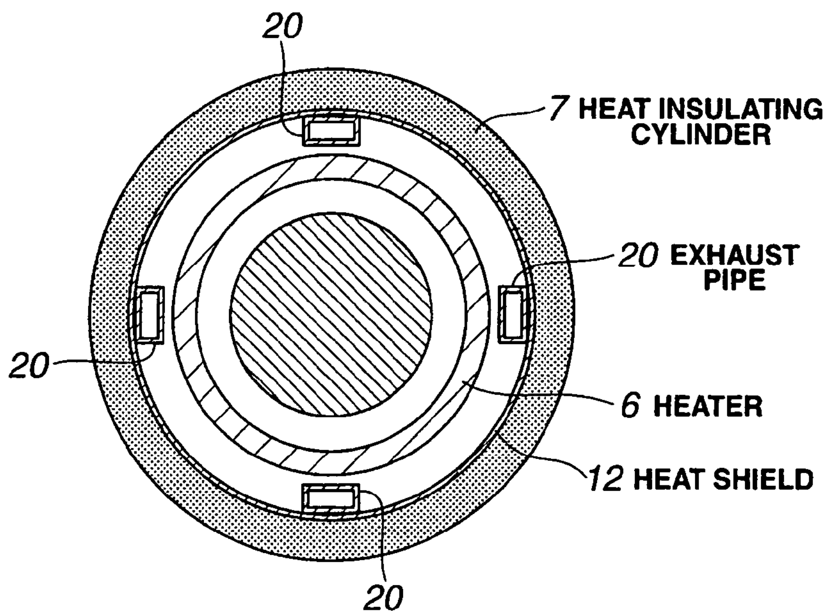
FIG. 11 is a view showing another embodiment.
Figure 12:
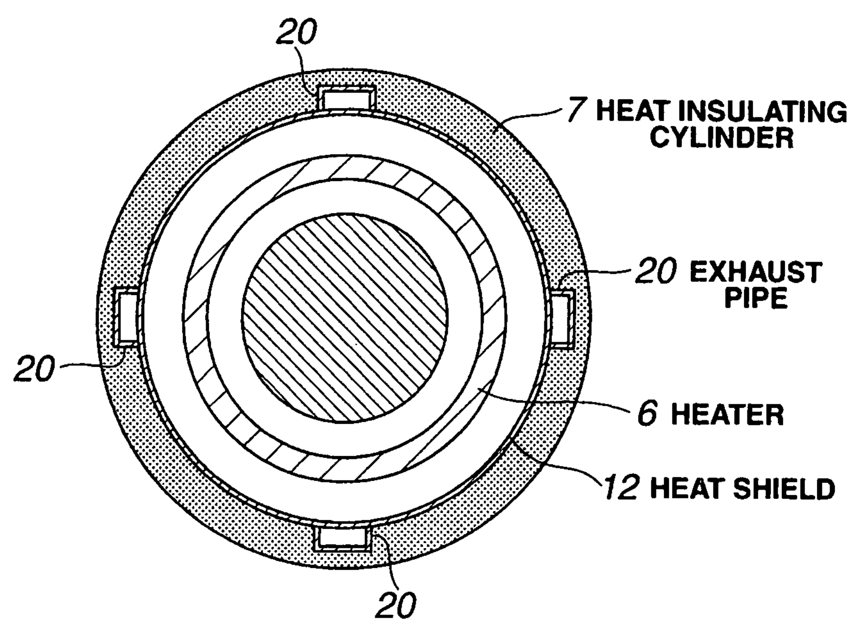
FIG. 12 is a view showing another embodiment.

The invention claimed is:

1. A semiconductor single crystal production device including a chamber in which a crucible for melting a raw material of a semiconductor single crystal, a round-cylindrical heater that is provided around the crucible and that heats the raw-material in the crucible and round-cylindrical heat insulating cylinder that is provided outside the round-cylindrical heater so as to surround the periphery of the heater and that insulate a radiant heat are disposed, the semiconductor single crystal production device having a pulling-up mechanism for immersing a seed crystal into the melted raw material and pulling up a single crystal, characterized in that:

a round-cylindrical heat shield made of an insulating material is provided at the inner circumferential surface of the insulating cylinder, a plurality of exhaust pipes respectively composed of round-cylindrical members are intermittently provided between the heater and the heat shield along a peripheral direction of the heater, and upper ends of the plurality of exhaust pipes are positioned above the upper end of the heater, and lower ends of plurality of exhaust pipes are respectively positioned to communicate with a plurality of exhaust ports formed in a heat insulating bottom in the chamber.

2. The semiconductor single crystal production device according to claim 1, wherein an exhaust path sectional area of the plurality of exhaust pipes is greater than a total sectional area of the plurality of exhaust ports.

3. The semiconductor single crystal production device according to claim 2, wherein the plurality of exhaust pipes are dividable into an upper part and a lower part.

4. The semiconductor single crystal production device according to claim 2, wherein the plurality of exhaust pipes are ones having partitions independent of the heat shield.

5. The semiconductor single crystal production device according to claim 1, wherein the heater, the exhaust pipes and the one or more heat shields are sequentially disposed from a center of the crucible toward the outside in a radial direction of the crucible.

6. The semiconductor single crystal production device according to claim 2, wherein the plurality of exhaust pipes are dividable into an upper part and a lower part.

* * * * *